(12) United States Patent
Lee (10) Patent No.: US 8,893,953 B2
(45) Date of Patent: Nov. 25, 2014

(54) WIRE BONDING METHOD IN CIRCUIT DEVICE

(71) Applicant: Samsung Electronics Co., Ltd., Swuon-si (KR)

(72) Inventor: Joon-gil Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 48 days.

(21) Appl. No.: 13/754,035

(22) Filed: Jan. 30, 2013

(65) Prior Publication Data

US 2013/0196452 A1  Aug. 1, 2013

(30) Foreign Application Priority Data

Jan. 30, 2012 (KR) .................. 10-2012-0009206

(51) Int. Cl.
| | | |
|---|---|---|
| *B23K 31/02* | (2006.01) | |
| *B23K 20/00* | (2006.01) | |
| *H01L 23/00* | (2006.01) | |
| *H01L 21/66* | (2006.01) | |

(52) U.S. Cl.
CPC ....... *H01L 22/10* (2013.01); *H01L 2224/85986* (2013.01); *B23K 20/007* (2013.01); *H01L 24/78* (2013.01); *H01L 2224/85051* (2013.01); *H01L 2933/0066* (2013.01); *H01L 24/48* (2013.01); *H01L 2224/85045* (2013.01); *H01L 2224/48247* (2013.01); *H01L 2224/48997* (2013.01); *H01L 24/85* (2013.01); *H01L 2224/78301* (2013.01); *H01L 2224/48091* (2013.01); *H01L 2224/859* (2013.01); *H01L 2224/85181* (2013.01); *H01L 2224/48465* (2013.01); *H01L 2224/85205* (2013.01)
USPC .......... 228/102; 228/4.5; 228/103; 228/180.5

(58) Field of Classification Search
None
See application file for complete search history.

(56) References Cited

U.S. PATENT DOCUMENTS

| | | | | |
|---|---|---|---|---|
| 4,707,579 | A | * | 11/1987 | McKiel, Jr. ................. 219/56.22 |
| 4,984,730 | A | * | 1/1991 | Gobel et al. .................... 228/1.1 |
| 5,443,200 | A | * | 8/1995 | Arikado ......................... 228/102 |
| 7,085,699 | B2 | | 8/2006 | Variyam |
| 2003/0049882 | A1 | * | 3/2003 | Yin et al. ....................... 438/106 |
| 2005/0061849 | A1 | * | 3/2005 | Takahashi ...................... 228/4.5 |
| 2007/0262119 | A1 | * | 11/2007 | Ramkumar et al. .......... 228/101 |
| 2010/0230476 | A1 | | 9/2010 | Gillotti et al. |
| 2011/0017806 | A1 | | 1/2011 | Cayabyab et al. |
| 2013/0119114 | A1 | * | 5/2013 | Zong et al. .................... 228/104 |
| 2013/0125390 | A1 | * | 5/2013 | Gillotti ............................ 29/825 |
| 2014/0034712 | A1 | * | 2/2014 | Maeda et al. ................. 228/160 |

FOREIGN PATENT DOCUMENTS

| | | | |
|---|---|---|---|
| JP | 2008-140865 A | | 6/2008 |
| KR | 1020030005037 A | | 1/2003 |
| KR | 100628706 A | * | 9/2006 |
| KR | 1020070081226 A | | 8/2007 |
| KR | 1020100030573 A | | 3/2010 |

* cited by examiner

*Primary Examiner* — Kiley Stoner
(74) *Attorney, Agent, or Firm* — Sughrue Mion, PLLC (57) ABSTRACT

A wire bonding method in a circuit device mounted on a lead frame, the wire bonding method including: counting a stop time if an operation of a capillary stops; removing a contaminated free air ball (FAB) formed on an end of the capillary if the stop time exceeds a reference time; forming a new FAB; and restarting a wire bonding process.

12 Claims, 10 Drawing Sheets

WIRE BONDING METHOD IN CIRCUIT DEVICE

CROSS-REFERENCE TO RELATED APPLICATION

This application claims the priority from Korean Patent Application No. 10-2012-0009206, filed on Jan. 30, 2012, in the Korean Intellectual Property Office, the disclosure of which is incorporated herein in its entirety by reference.

BACKGROUND

1. Field

Apparatuses and methods consistent with inventive concept relate to wire bonding in circuit devices.

2. Description of the Related Art

Circuit devices, as for example, light emitting diodes (LEDs) are semiconductor devices that may emit light of various colors by configuring a light emitting source through PN junction of a compound semiconductor. LEDs have long life spans, small sizes and light weight and may be driven with low voltages due to strong directivity of light. In addition, LEDs can withhold shock and vibration, do not require a warm-up time and complex driving and may be packaged in various shapes and thus may be applied in various applications.

A circuit device, such as an LED, is manufactured as a light emitting device package after undergoing a packaging process in which the circuit device is mounted on a metal lead frame and a mold frame. In this procedure, an electrode pad and a lead frame of the circuit device are electrically connected to each other by performing a wire bonding process.

SUMMARY

Exemplary embodiments may address at least the above problems and/or disadvantages and other disadvantages not described above. Also, exemplary embodiments are not required to overcome the disadvantages described above, and an exemplary embodiment may not overcome any of the problems described above.

One or more exemplary embodiments provide wire bonding methods and apparatuses that may obtain durability of bonding wires.

According to an aspect of an exemplary embodiment, there is provided a wire bonding method in a circuit device mounted on a lead frame, the wire bonding method including: counting a stop time if an operation of a capillary stops; removing a contaminated free air ball (FAB) formed on an end of the capillary if the stop time exceeds a reference time; and forming a new FAB and restarting a wire bonding process.

The removing of the contaminated FAB may include moving the capillary to a dummy area of the lead frame other than an area on which the circuit device is mounted and bonding the contaminated FAB to the dummy area.

The wire bonding method may further include releasing a fixing unit for fixing the lead frame on a support block if the stop time exceeds the reference time. The wire bonding method may further include fixing the lead frame on the support block by driving the fixing unit after the contaminated FAB is removed.

The reference time may include about three minutes.

According to another aspect of an exemplary embodiment, there is provided a wire bonding method in a circuit device mounted on a lead frame, the wire bonding method including: releasing a fixing unit for fixing the lead frame on a support block if an operation of a wire bonding apparatus stops due to an error; counting a stop time and standing by until the error is removed; performing dummy bonding in a dummy area of the lead frame if the stop time exceeds a reference time when the error has been removed; and restarting a wire bonding process.

The wire bonding method may further include fixing the lead frame on the support block by driving the fixing unit before the restarting of the wire bonding process is performed.

The performing of the dummy bonding may include bonding a FAB to the dummy area if the operation of the wire bonding apparatus stops in a state where the FAB is formed on an end of the capillary.

The performing of the dummy bonding may include bonding a FAB to the dummy area after the FAB is formed on the end of the capillary if the operation of the wire bonding apparatus stops in a state where the FAB is not formed on the end of the capillary.

The reference time may include about three minutes.

BRIEF DESCRIPTION OF THE DRAWINGS

The above and/or other aspects will become more apparent by describing certain exemplary embodiments, with reference to the accompanying drawings, in which.

DETAILED DESCRIPTION

Certain exemplary embodiments are described in greater detail below with reference to the accompanying drawings.

In the following description, like drawing reference numerals are used for the like elements, even in different drawings. The matters defined in the description, such as detailed construction and elements, are provided to assist in a comprehensive understanding of exemplary embodiments. However, exemplary embodiments can be practiced without those specifically defined matters. Also, well-known functions or constructions are not described in detail since they would obscure the application with unnecessary detail.

Figure 1:
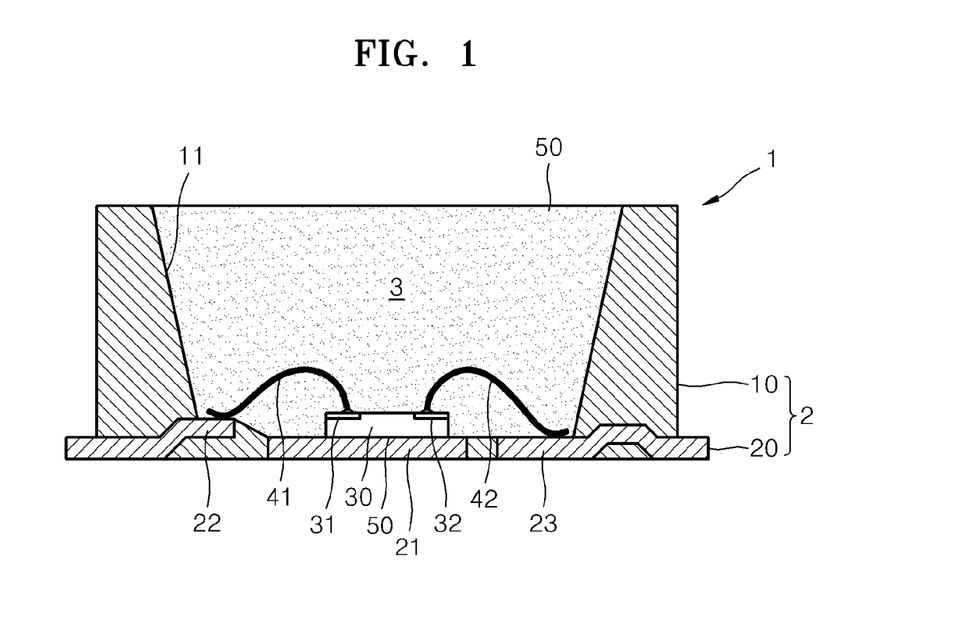
FIG. 1 is a cross-sectional view of a light emitting device package that is manufactured by a wire bonding method according to an exemplary embodiment.

FIG. 1 is a cross-sectional view of a light emitting device package 1 that is manufactured by a wire bonding method according to an exemplary embodiment. Referring to FIG. 1, the light emitting device package 1 may include a package main body 2 having a cavity 3 in which a light emitting device chip 30 is mounted.

The light emitting device chip 30 may be a light emitting diode chip. The light emitting diode chip may emit blue, green, or red light depending on material used in forming a compound semiconductor that constitutes the light emitting diode chip. For example, a blue light emitting diode chip may have a quantum well layer structured active layer in which a gallium nitride (GaN) layer and an indium gallium nitride (InGaN) layer are alternately formed. A P-type clad layer and an N-type clad layer formed of an $Al_xGa_yN_z$ compound semiconductor may be formed in upper and lower portions of the active layer. As another example, the light emitting diode chip may emit colorless ultraviolet (UV) rays. In the present exemplary embodiment, the light emitting device chip 30 is the light emitting diode chip. However, this is not limited thereto. For example, the light emitting device chip 30 may be a UV light diode chip, a laser diode chip, an organic light emitting diode chip, or the like.

The package main body 2 may include a conductive lead frame 20 and a mold frame 10. The lead frame 20 may include a mounting portion 21 on which the light emitting device chip 30 is mounted, and first and second terminal portions 22 and 23 that are electrically connected to the light emitting device chip 30. The lead frame 20 may be manufactured by performing a press process, an etching process, or the like on a conductive metal plate such as aluminum (Al), copper (Cu), etc. A cleaning process of removing a foreign substance attached to the lead frame 20 may be performed prior to an injection molding process that will be described below. In addition, a plating process may be performed to perform surface processing of the lead frame 20.

The mold frame 10 may be assembled with the lead frame 20 by performing a process, for example, an insert injection molding, or the like. The mold frame 10 may be formed of electric insulation polymer, for example. The mold frame 10 may be formed by injection molding of a polymer, such as polyphthal amide (PPA), liquid crystal polymer (LCP), or the like, on the lead frame 20 by performing an insert injection molding, or the like. The mold frame 10 is formed in a concave shape in which the mounting portion 21 and the first and second terminal portions 22 and 23 are exposed to the outside.

The cavity 3 is formed in the package main body 2. The mounting portion 21 and the first and second terminal portions 22 and 23 constitute a lower structure of the cavity 3. An inside surface 11 of the cavity 3 may be a reflective surface which reflects the light emitted from the light emitting device chip 30 is reflected and which is further emitted from the light emitting device package 1. A material having high light reflectivity, such as silver (Ag), platinum (Pt), titanium (Ti), chromium (Cr), copper (Cu), or the like, may be coated or deposited on the inside surface 11, or a plate formed of one or more of the above-mentioned materials may be bonded to the inside surface 11. At least a part of the inside surface 11 may be formed by the lead frame 20.

When the light emitting device chip 30 is mounted on the lead frame 20 and the mold frame 10 is assembled with the lead frame 20, a wire bonding process for electrically connecting a cathode and an anode of the light emitting device chip 30 and the first and second terminal portions 22 and 23 is performed. The first and second terminal portions 22 and 23 may be connected to the cathode and the anode of the light emitting device chip 30, respectively. A first electrode pad 31 and a second electrode pad 32 may be disposed on the light emitting device chip 30 and may be electrically connected to the cathode and the anode, respectively. Each of the first and second electrode pads 31 and 32 may be connected to each of the first and second terminal portions 22 and 23 by using first and second bonding wires 41 and 42, respectively. Parts of the first and second terminal portions 22 and 23 are exposed to an outside of the mold frame 10 and serve as terminals for supplying electric current to the light emitting device chip 30.

Thus, the light emitting device package 1 has a construction in which the light emitting device chip 30 is disposed on a surface forming a bottom of the cavity 3, and the inside surface 11 of the package main body 2 serves as a reflective portion for reflecting light and emitting light to an outside of the light emitting device package 1. The mounting portion 21 and the first and second terminal portions 22 and 23 of the lead frame 20 are exposed to a lower portion of the mold frame 10 and may serve as heat dissipation surfaces.

An encapsulation layer 50 formed of a light-transmitting resin, such as silicon, or the like, may be formed in the cavity 3 to protect the light emitting device chip 30 and the first and second bonding wires 41 and 42 from an external environment after wire bonding is completed. The encapsulation layer 50 may include a fluorescent substance that changes light emitted from the light emitting device chip 30 into a light of desired color. The fluorescent substance may be a single species or a plurality of species mixed in a predetermined proportion.

Figure 2:
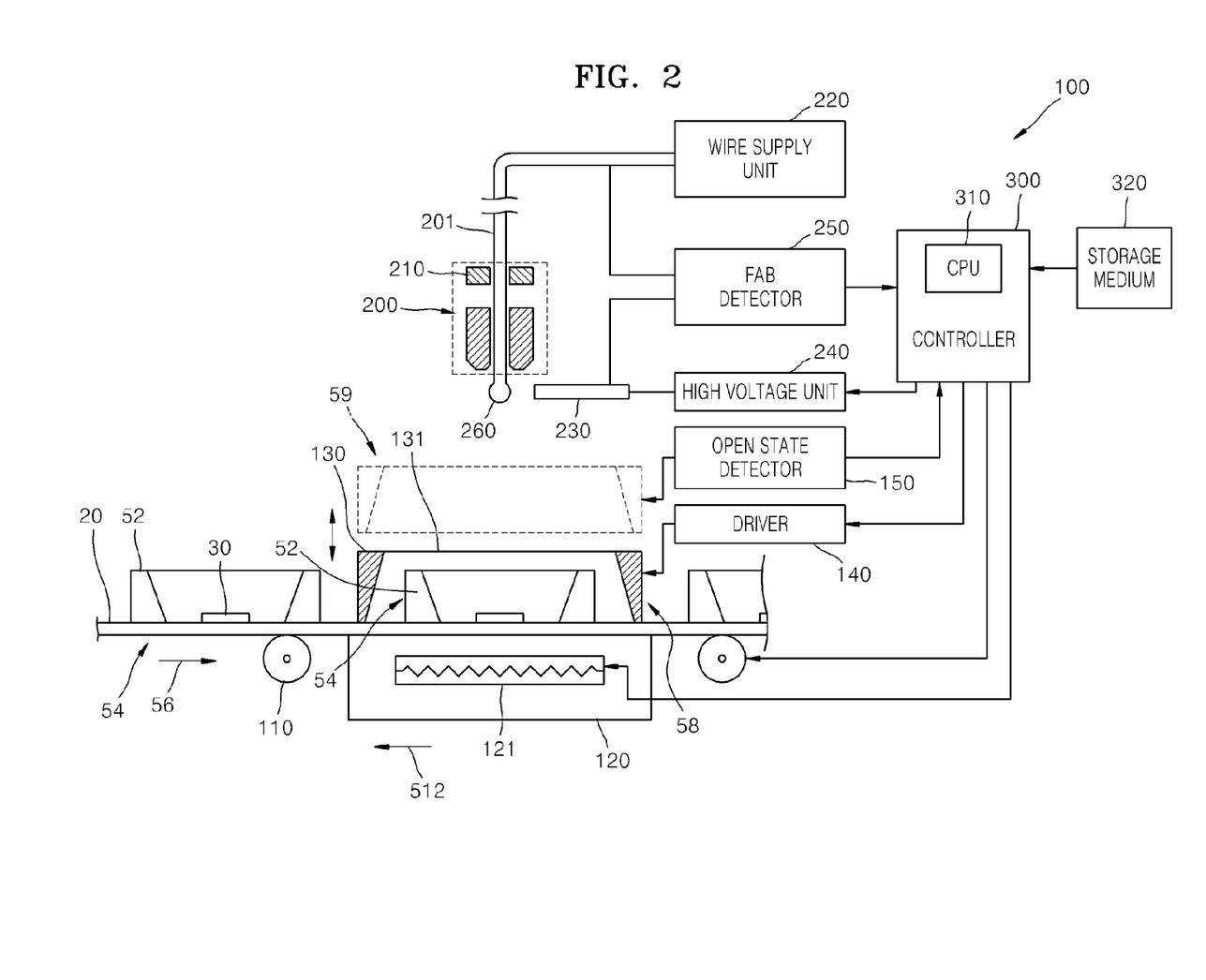
FIG. 2 is a perspective view of an exemplary structure of a wire bonding apparatus to which a wire bonding method according to an exemplary embodiment is applied.

FIG. 2 is a perspective view of an exemplary structure of a wire bonding apparatus 100. Referring to FIG. 2, a plurality of mold frames 52 are assembled with the lead frame 20, for example, by injection molding, thus forming a plurality of package main bodies 54. The light emitting device chip 30 is mounted in the cavity 3 of each package main body 54. The lead frame 20 is transferred by a transfer unit 110. For example, one of the package main bodies 54 is transferred by the transfer unit 110 to a support block 120. A heater 121 for warming up the lead frame 20 may be disposed on the support block 120. A temperature of the heater 121 may be increased to about 170 to 200° C.

A fixing unit 130 may be moved by a driver 140 between a fixing position 58 (indicated by solid line of FIG. 2), in which the lead frame 20 is fixed on the support block 120, for example, and a release position 59 (indicated by dotted line of FIG. 2), in which the lead frame 20 is released from the support block 120. The driver 140 may move the fixing unit 130 to the fixing position 58 and the release position 59 by moving the fixing unit 130 in upward and downward directions, for example. An opening 131 is formed in the fixing unit 130 for a capillary 200 to access the package main body 54 for wire bonding. An open state detector 150 detects a position of the fixing unit 130. The open state detector 150 may be implemented as a sensor using an optical detection method, an electrical detection method, a mechanical detection method, or a combination thereof, for example.

A wire 201 is supplied via the capillary 200. A clamp 210 may be switched between a clamping state in which the wire 201 is clamped, and a release state in which the wire 201 is released. The capillary 200 may be moved in upward and downward directions and in a transverse direction 512 with respect to a movement in the upward and downward directions by using a driving unit (not shown). The transverse direction 512 may be substantially parallel to a movement direction 56 and may be coincidental or opposing the movement direction 56. The wire 201 may be a conductive wire formed of gold, copper, silver, or the like, for example. A vibrator for inducing vibration, as for example, an ultrasonic vibrator (not shown) may be embedded in the capillary 200. A heating unit may be implemented to form a FAB in the wire 201 exposed at an end portion of the capillary 200. The heating unit may be a discharge electrode 230, for example. The discharge electrode 230 causes an instantaneous discharge phenomenon between the discharge electrode 230 and the wire 201 and melts the wire 201 by a high voltage supplied from a high voltage unit 240. Thus, a first FAB 260 of substantially spherical shape may be formed on an end portion of the wire 201. A FAB detector 250 detects whether the first FAB 260 is normally formed, i.e., without an error. For example, the FAB detector 250 may be a current sensor that detects a current flowing between the discharge electrode 230 and the wire 201 connected to each other.

A controller 300 controls the wire bonding process and may include a central processing unit (CPU) 310. A control program for controlling the wire bonding process may be stored in a storage medium 320. The storage medium 320 may be a read only memory (ROM), an erasable and programmable ROM (EPROM), a CD-ROM, a DVD-ROM, a universal serial bus (USB) memory, a hard disk, or the like. The controller 300 may control the wire bonding process by reading the control program from the storage medium 320 and by driving the control program. The control program may be upgraded by exchanging the storage medium 320 or storing a new control program in the storage medium 320.

Hereinafter, an example of a wire bonding method will be described.

The wire bonding process may start when the controller 300 reads the control program stored in the storage medium 320 and executes the control program. The controller 300 may control elements of the wire bonding apparatus to perform the wire bonding process based on the control program.

The package main body 54 is aligned on the support block 120 by transferring the lead frame 20 by the transfer unit 110. Then, the fixing unit 130 is lowered into the fixing position 58 by the driver 140, and the lead frame 20 becomes fixed on the support block 120.

Figure 3:
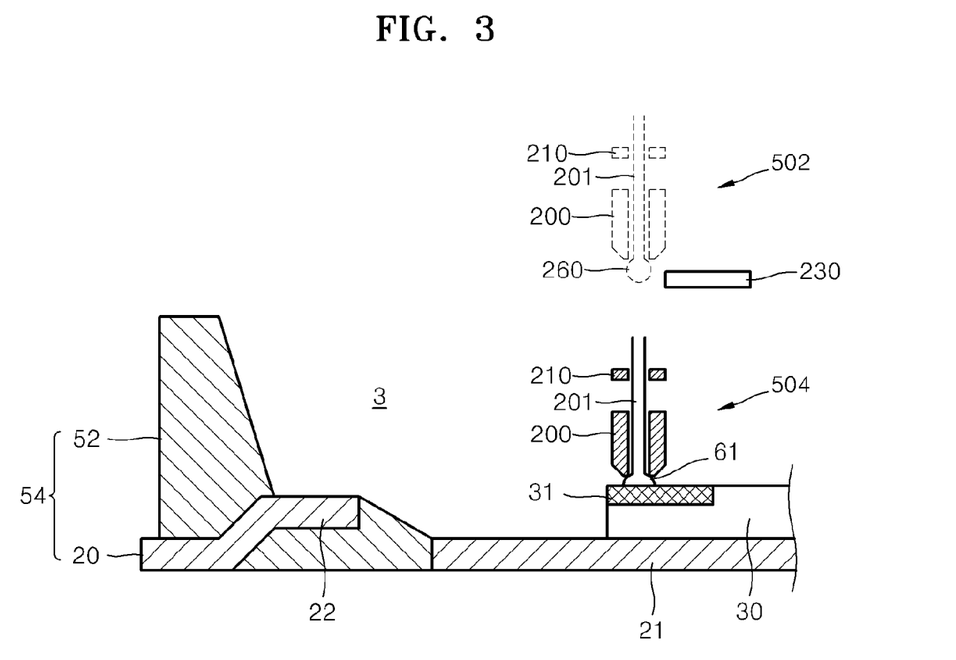
FIG. 3 is a cross-sectional view of a connection portion formed by bonding a wire to an electrode pad of a light emitting device chip, according to an exemplary embodiment.

FIG. 3 is a cross-sectional view of a first connection portion 61 formed by bonding the wire 201 to a first electrode pad 31 of the light emitting device chip 30. As indicated by dotted line of FIG. 3, the capillary 200 is disposed in a position 502 above the package main body 54. When the discharge electrode 230 contacts the end of the wire 201 supplied via the capillary 200 and a high voltage is supplied by the high voltage unit 240 to the discharge electrode 230, discharge occurs between the end of the wire 201 and the discharge electrode 230. Thus, the end of the wire 201 is melted, and the first FAB 260 is formed. The clamp 210 is maintained in the clamping state, and the capillary 200 is lowered. As the capillary 200 being lowered to a lowered position 504, the wire 201 is withdrawn from a wire supply unit 220. The first FAB 260 contacts the first electrode pad 31 of the light emitting device chip 30, and the capillary 200 applies an appropriate load to the first FAB 260 to bond the first FAB 260 to the first electrode pad 31. The capillary 200 may induce ultrasonic vibration while applying the load to the first FAB 260. Thus, the first FAB 260 is bonded to the first electrode pad 31 so that the first connection portion 61 is formed. Such a bonding method is referred to as a ball bonding method.

Figure 4:
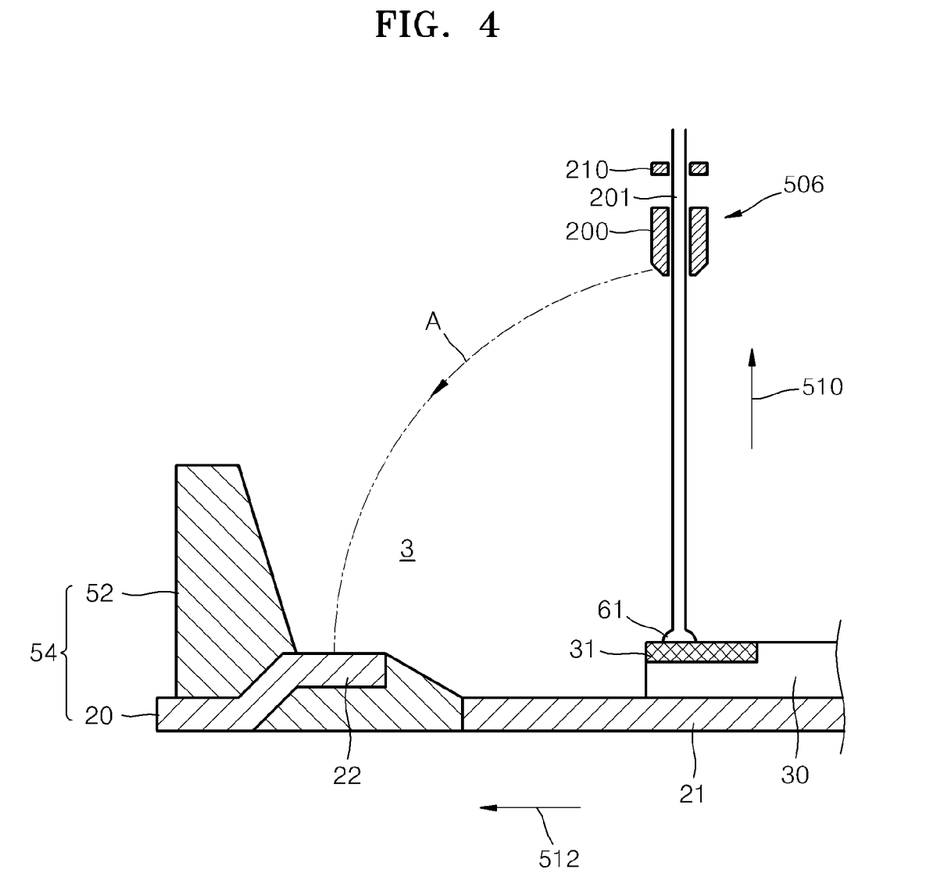
FIG. 4 is a cross-sectional view of a capillary elevated to form a shape of a bonding wire, according to an exemplary embodiment.

Next, a process of elevating the capillary 200 is performed to form a loop-shaped bonding wire. FIG. 4 is a cross-sectional view of the capillary 200 which is elevated to a position 506 above the package main body 54, from the lowered position 504, to form a shape of the first bonding wire 41. With reference to FIG. 4, while the capillary 200 is elevated, the clamp 210 is maintained in the release state. The position 506 of the elevation of the capillary 200 may be properly determined in consideration of a distance between the first electrode pad 31 and the first terminal portion 22 and a wire loop height. The position 506 may be the same as the position 502 or may be a different position. The path of the capillary 200 in the elevated state above the package main body 54 may be determined according to a desired or predetermined shape of a wire loop. The capillary 200 may be elevated in a vertical direction 510, with respect to a movement direction 56, and may be moved in a transverse direction 512 while being elevated.

Figure 5:
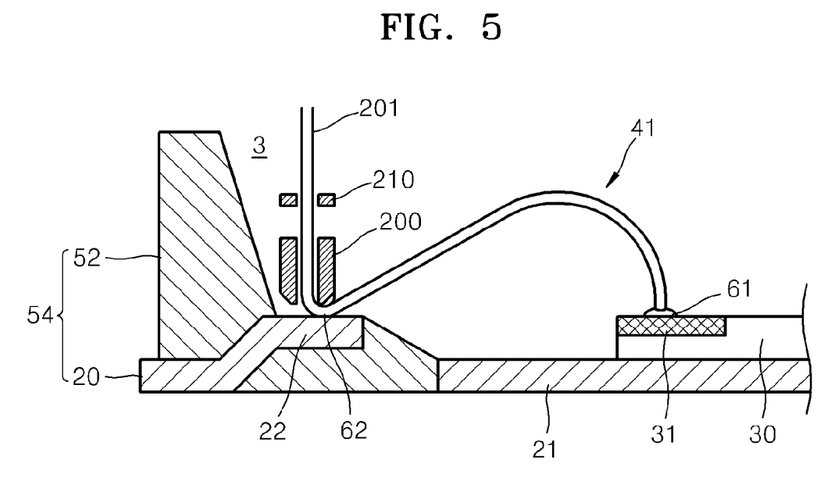
FIG. 5 shows a connection portion formed by bonding a wire to a terminal portion of a lead frame, according to an exemplary embodiment.

When the capillary 200 reaches an elevation position 506, the elevation operation is terminated, and the capillary 200 is lowered to the first terminal portion 22 along a curve-shaped trajectory indicated by arrow A of FIG. 4. While the capillary 200 is lowered, the clamp 210 is maintained in the clamping state. FIG. 5 is a cross-sectional view of a second connection portion 62 formed by bonding the wire 201 to the first terminal portion 22 of the lead frame 20. When the wire 201 contacts the first terminal portion 22, the shape of the first bonding wire 41 is formed as a loop, as illustrated in FIG. 5. In this state, the wire 201 is bonded to the first terminal portion 22 by applying an appropriate load and ultrasonic vibration to the wire 201 so that the second connection portion 62 is formed.

Figure 6:
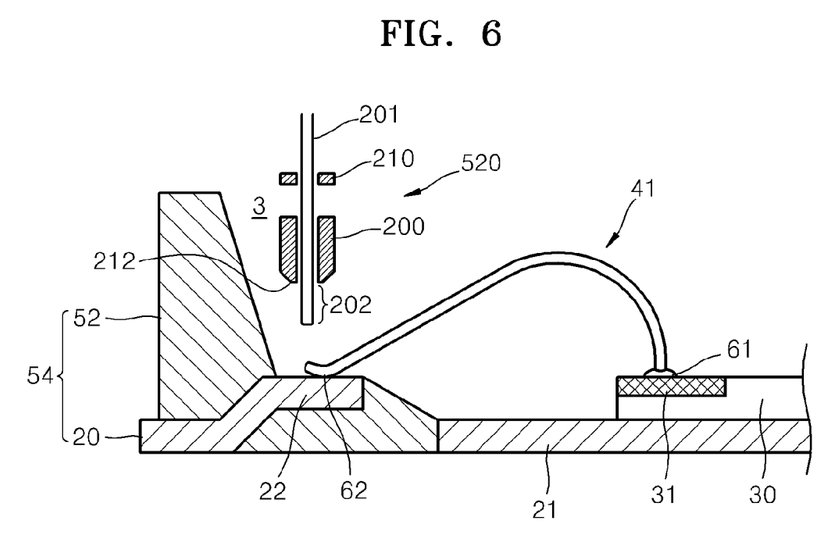
FIG. 6 shows a wire that is cut after the connection portion is formed, according to an exemplary embodiment.

FIG. 6 shows the wire 201 that is cut after the second connection portion 62 is formed. In detail, while the clamp 210 is maintained in the clamping state, the capillary 200 is elevated, the wire 201 is cut, and the wire bonding process is completed. Such a bonding method is referred to as a stitch bonding method.

After the wire 201 is cut, the clamp 210 is changed into the release state and the capillary 200 is further elevated to a position 520, to form a tail 202 extending beyond the end portion 212 of the capillary 200. The tail 202 serves to form the second FAB 262 that is used in the subsequent process described below.

In order to improve a bonding strength of the second connection portion 62, a ball bonding may be performed, further to the stitch bonding. For example, as indicated by dotted line of FIG. 3, the capillary 200 may be disposed in the position 502 elevated from the package main body 54. The discharge electrode 230 may contact the tail 202 of the wire 201 extending from the capillary 200. The tail 202 of the wire 201 may be melted and the second FAB 262 may be formed. Then, while the clamp 210 is maintained in the clamping state, the capillary 200 is lowered, so that the second FAB 262 contacts the second connection portion 62. The capillary 200 may apply an appropriate load to the second FAB 262 and may induce ultrasonic vibration on the second FAB 262 to bond the second FAB 262 to the second connection portion 62. The tail 202 may be formed prior to forming the first FAB 260 similarly to what is described above with reference to the second FAB 262.

Figure 7:
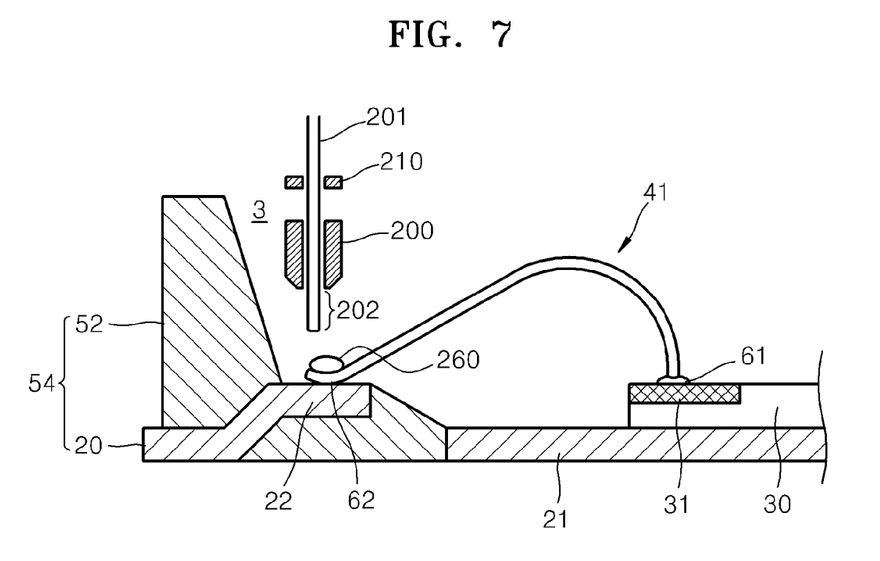
FIG. 7 shows a ball bonding, according to an exemplary embodiment.

FIG. 7 shows a ball bonding added to the second connection portion 62 to increase a bonding force. As illustrated in FIG. 7, the second FAB 262 is bonded to the second connection portion 62. If the clamp 210 is maintained in the clamping state, the capillary 200 is raised, the wire 201 is cut, and the wire bonding process is completed. After the wire 201 is cut, the clamp 210 is changed into the release state and is further elevated, and the tail 202 is formed on the end portion 212 of the capillary 200.

The second bonding wire 42 that connects the second electrode pad 32 and the second terminal portion 23 of the light emitting device chip 30 may be formed by the same or similar process to the process described above.

If an error occurs during the above described wire bonding process, the wire bonding process may be stopped. An error may occur when the first FAB 260 or the second FAB 262 having an inappropriate size is formed, when the wire 201 is being cut, when the capillary 200 is erroneously moved, and the like.

Referring to FIGS. 6 and 7, the size of the first FAB 260 or the second FAB 262 depends on the length of the tail 202. When the capillary 200 is elevated after the first connection portion 61 or the second connection portion 62 is formed, the clamp 210 may be changed into the clamping state from the release state slower or faster than a predetermined time. As a result, the tail 202 may be formed of an inappropriate length. In this case, when discharge occurs using the discharge electrode 230, the first FAB 260 or the second FAB 262 may be too small or may be far away from the end of the capillary 200. Such a defect in formation of the first FAB 260 or the second FAB 262 may be detected by the FAB detector 250. If a distance between the discharge electrode 230 and the tail 202 varies according to the length of the tail 202, a value of a current that flows through the wire 201 at a time of discharge varies. The FAB detector 250 detects the value of the current that flows through the wire 201 and transfers the detected current value to the controller 300. The controller 300 may determine whether a defect occurs in forming the first FAB 260 or the second FAB 262, based on the current value transferred from the FAB detector 250.

In addition, when the wire 201 is being cut, the controller 300 may stop the operation of the wire bonding apparatus if, for example, an erroneous wire tension is detected by a tension detector (not shown) that detects the tension of the wire 201 indicative of whether the wire 201 is cut.

Accordingly, when a process error occurs, as described above, the controller 300 may stop the operation of the wire bonding apparatus. The controller 300 may turn on a warning light or generate a warning sound to inform a process manager or a user of an occurrence of an error. The controller 300 may also report an error on a process management screen (not shown). The controller 300 may facilitate the release position 59 by lifting the fixing unit 130, which fixes the lead frame 20 on the support block 120, in order to communicate the error in a visible manner. The position of the fixing unit 130 may be communicated to the controller 300 by the open state detector 150.

As described above, when an error occurs, the wire bonding apparatus is maintained in a standby state until an action for removing the error is completed by the process manager or a user. In the standby state, the first FAB 260 or the second FAB may be exposed to the air. In this case, a foreign substance may attach onto the surface of the first FAB 260 or the second FAB 262. The lead frame 20 is warmed up by the heater 121 while being supported on the support block 120, and a foreign substance, such as silicon contained in gas discharged from the mold frame 52, and the like may get attached to the first FAB 260 or the second FAB 262.

The process of removing the contaminated FAB is described in detail below. Although the reference is made to the first FAB 260, the following is also applicable to the second FAB 262.

Figure 8:
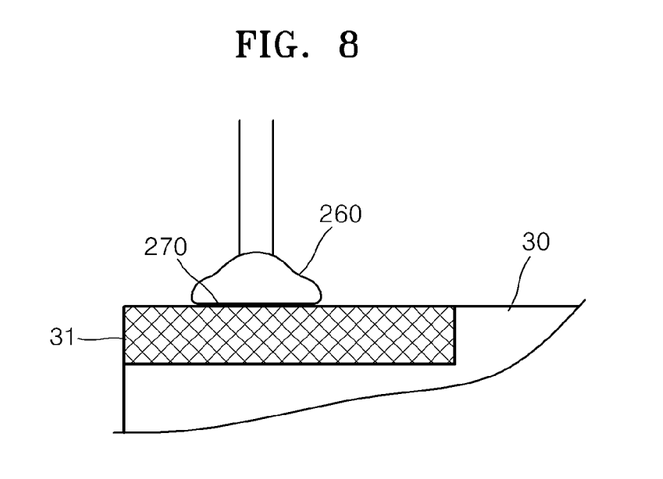
FIG. 8 shows an interface formed by a foreign substance interposed between a FAB and the electrode pad.

FIG. 8 shows an interface 270 formed by a foreign substance that may be interposed between the first FAB 260 and the first electrode pad 31 or the second electrode pad 32 when the FAB contaminated by the foreign substance is bonded. The interface 270 may lower a bonding force between the first electrode pad 31 or the second electrode pad 32 and the first FAB 260. Lowered bonding force is not manifested in an electrical test, an optical test, or in a bonding strength test which are carried out during or after the wire bonding process is completed, but may cause a progressive defect which may occur when the first and second connection portions 61 and 62 become separated from the first electrode pad 31 or the second electrode pad 32 or from the first or second terminal portion 22 and 23 while a product is produced and is being used and, thus, this may greatly lower the reliability of the product. That is, when the wire bonding process is performed in the state where the foreign substance is attached to the first FAB 260, an electrical or optical defect does not occur, and the bonding strength of the product may also not be defective.

Whether the foreign substance is attached to the first FAB 260 may be determined based on a stop time duration. When the process is stopped due to an error during the process, if the stop time exceeds a predetermined reference time, the wire bonding process may be resumed by removing the first FAB 260 and making a new FAB so the defects caused by the lowered bonding force may be prevented. Lowering of the bonding force caused by the foreign substance may be checked by carrying out a residue test. For example, the amount of a residue of a wire that remains on an electrode pad after a ball shear test (BST) is carried out is investigated by varying the stop time duration. As the stop time duration increases, the residue of the wire on the electrode pad decreases. The lower the residue of the wire on the electrode pad, the higher is a possibility that the first FAB 260 may become detached from the electrode pad while the product is being used.

Table 1 shows experimental results of a residue test on a cathode electrode pad according to a stop time duration when the ball bonding is performed, and Table 2 shows experimental results of a residue test on an anode electrode pad according to a stop time duration when the ball bonding is performed. In Tables 1 and 2, B/H is the height of a bonded ball, B/S is a width of the bonded ball, and WPT is a bonding resistant force when a wire loop is pulled out in an upward direction.

TABLE 1

| Test Item | Stop Time duration (minute) | | | | |
|---|---|---|---|---|---|
| | 0 | 5 | 10 | 20 | 30 |
| B/H | 10.6 | 11.2 | 10.2 | 11.5 | 13.3 |
| B/S | 71.4 | 72 | 74 | 71 | 74 |
| WPT | 10.7 | 10.2 | 10.6 | 10.8 | 10.2 |
| BST | 35.1 | 34.5 | 36.1 | 35.3 | 33.9 |
| Residue (%) | 100 | 100 | 60 | 40 | 50 |

TABLE 2

| Test Item | Stop Time duration (minute) | | | | |
| --- | --- | --- | --- | --- | --- |
| | 0 | 5 | 10 | 20 | 30 |
| B/H | 10.6 | 10.5 | 10.5 | 11.2 | 10.2 |
| B/S | 69 | 71 | 71 | 70 | 69 |
| BST | 36.16 | 40.19 | 33.08 | 30.04 | 31.31 |
| Residue (%) | 100 | 30 | 40 | 10 | 10 |

As seen from the above results of Tables 1 and 2, if the stop time duration exceeds about 5 minutes, the amount of residue reduces. By reflecting the above-mentioned experimental results, the predetermined reference time may be determined as about three minutes in consideration of a safety rate. When the wire bonding process is stopped for about three minutes or more due to an error, a process of removing the first FAB 260 contaminated before the wire bonding process restarts is performed.

Figure 9:
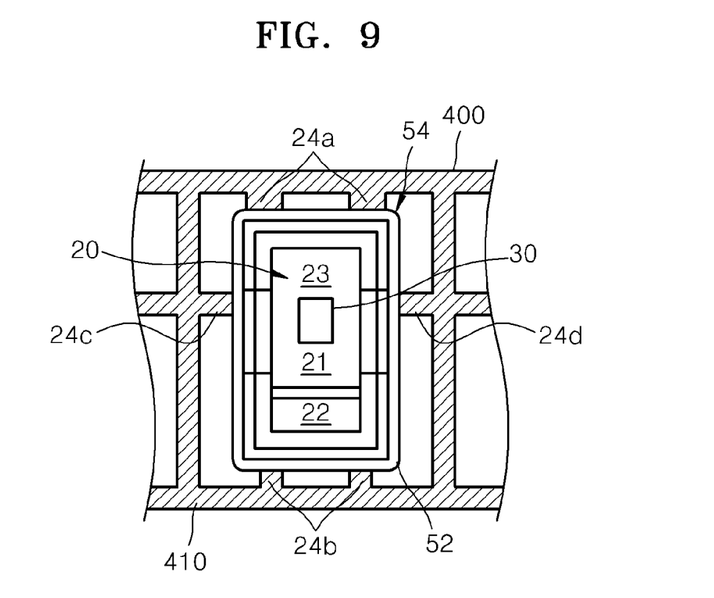
FIG. 9 is a cross-sectional view of a dummy area of a lead frame.

FIG. 9 is a cross-sectional view of a dummy area 410 of the lead frame 20. Referring to FIG. 9, the lead frame 20 including the mounting portion 21 and the first and second terminal portions 22 and 23 is formed by pressing a metal plate 400, for example. The lead frame 20 is maintained connected to the metal plate 400 via trimming portions 24a, 24b, 24c, and 24d. The mold frame 10, 52 is molded on the lead frame 20 by injection molding. After the wire bonding process is completed, the package main body 54 including the lead frame 20 and the mold frame 10, 52 is detached from the metal plate 400 by performing a singulation process. Thus, an area indicated by hatching in FIG. 9 represents the dummy area 410 to be discarded after the singulation process is performed.

The process of removing the first FAB 260 may be performed by a dummy bonding process in which the first FAB 260 is bonded to the dummy area 410 of the lead frame 20 and is removed. For example, if a process restart command is input after the error of a corresponding process stop has been removed by the process manager or a user, the controller 300 controls the wire bonding apparatus 100 to lower the fixing unit 130 and to fix the lead frame 20 on the support block 120. In addition, the controller 300 controls the wire bonding apparatus 100 to move the capillary 200 to the dummy area 410.

Figure 10:
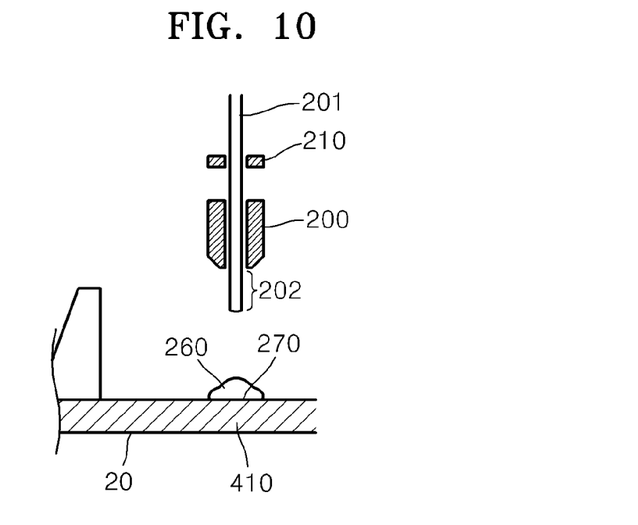
FIG. 10 is a cross-sectional view illustrating the dummy bonding performed in the dummy area of the lead frame to remove the contaminated FAB, according to an exemplary embodiment.

FIG. 10 is a cross-sectional view illustrating the dummy bonding performed in the dummy area 410 of the lead frame 20 to remove the contaminated first FAB 260. The capillary 200 is lowered in a state where the clamp 210 is maintained in the clamping state, and the first FAB 260 to which the foreign substance is attached contacts the dummy area 410 and is bonded to the dummy area 410 in a state where a load is applied to the first FAB 260 and ultrasonic vibration is induced on the first FAB 260. When the process of bonding the first FAB 260 to the dummy area 410 is completed, the clamp 210 is maintained in the clamping state and the capillary 200 is elevated. The wire 201 is cut, and the first FAB 260 is thereby removed from the capillary 200. After the wire 201 is cut, the clamp 210 is changed into the release state, is further elevated, and the tail 202 is formed on the end portion of the capillary 200 similarly to what is described with reference to FIG. 6.

After the first FAB 260 contaminated by the foreign substance is removed, the wire bonding process of connecting the first and second electrode pads 31 and 32 to respective first and second terminal portions 22 and 23 with the first and second bonding wires 41 and 42 is performed by the processes described above with reference to FIGS. 3 through 7.

The wire bonding process may stop in a state where the first FAB 260 is not formed on the end of the capillary 200 as occasion demands. In this case, the tail 202 exposed to the air may be contaminated by the foreign substance. Thus, when the stop time exceeds the predetermined reference time, the wire bonding process may restart after the contaminated tail 202 is removed. The contaminated tail 202 may be removed by performing dummy bonding in the dummy area 410 of the lead frame 20. The first FAB 260 may be formed using the contaminated tail 202 and bonded to the dummy area 410.

As described above, according to one or more of the exemplary embodiments when a time duration of the stopped wire bonding process and/or the standby state exceeds the predetermined reference time, the first FAB 260 or the tail 202 exposed to the air is removed before the wire bonding is restarted, so that the lowering of a bonding force of the wire 201 may be prevented.

Although the wire bonding method of the light emitting device package 1 including the package main body 2 or 54 having the cavity 3 formed therein has been described, an exemplary embodiment is not limited thereto. For example, the light emitting device package 1 may lack the cavity 3 or the mold frame 10, 52. Further, the described-above wire bonding methods may be applied in another type of a circuit device, for example, in a memory chip, or the like.

Figure 11:
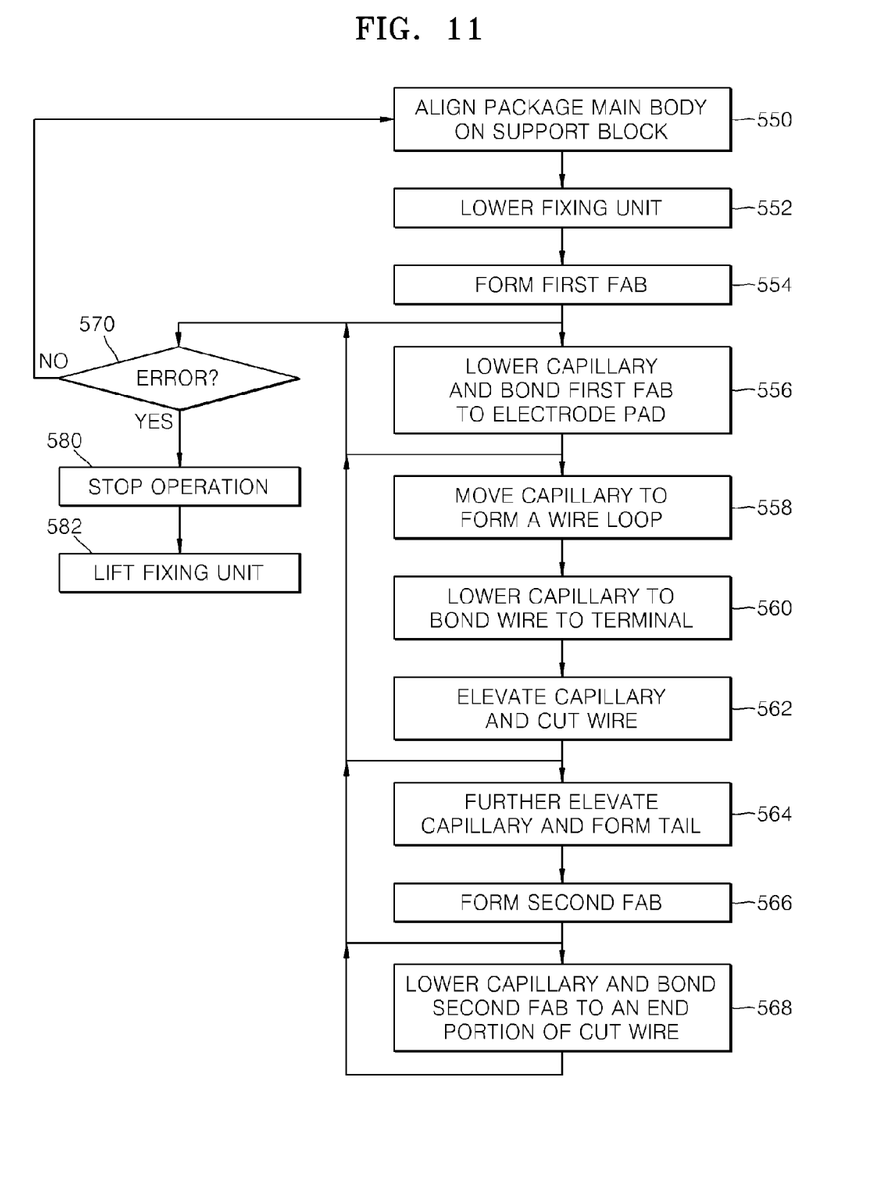
FIG. 11 illustrates a flowchart of a bonding method according to an exemplary embodiment.

FIG. 11 illustrates a bonding method according to an exemplary embodiment. In operation 550, the package main body 54 is aligned on the support block 120. In operation 552, the fixing unit 130 is lowered into the fixing position 58 and the lead frame 20 becomes fixed on the support block 120. In operation 554, the discharge electrode 230 contacts the end portion of the wire 201 and the first FAB 260 is formed. In operation 556, the capillary 200 is lowered to the lowered position 504 and the first FAB 260 is bonded to the first electrode pad 31.

In operation 558, the capillary 200 is moved to form a loop-shaped bonding wire. In operation 560, the capillary 200 is lowered and the wire 201 is bonded to the first terminal portion 22. In operation 562, the capillary 200 is elevated and the wire 201 is cut. In operation 564, the capillary 200 is further elevated to the position 520, to form a tail 202. In operation 566, the discharge electrode 230 contacts the tail 202 and the second FAB 262 is formed. In operation 568, the capillary 200 is lowered and the second FAB 262 is bonded to the second connection portion 62.

In operation 570, it is determined whether a process error is detected. If no process error is detected, the bonding process is repeated with a subsequent package main body aligned on the support block. If a process error is detected, the controller 300 stops the bonding apparatus, in operation 580. The controller 300 may further lift the fixing unit 130, in operation 582, so that the user can remove the error.

Figure 12:
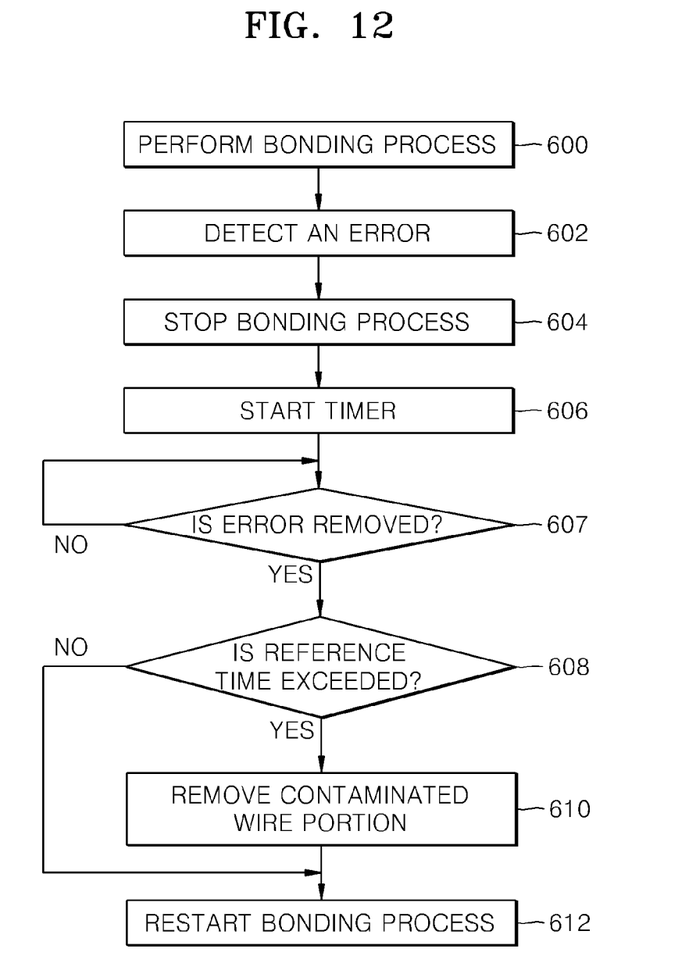
FIG. 12 illustrates a flowchart of a bonding method when an error is detected, according to an exemplary embodiment.

FIG. 12 illustrates a bonding method when an error is detected, according to an exemplary embodiment. In operation 600, the bonding method is performed. In operation 602, an error is detected, as described above. In operation 604, the controller 300 stops the bonding process so that the user can remove the error. In operation 606, a timer is started, to measure the stop time duration while the bonding process is stopped. In operation 607, it is determined whether the error is removed. If the error is removed, it is determined whether a value of the timer exceeds the reference time value, in operation 608. If a value of the timer does not exceed the reference time value, the bonding process is restarted. If a value of the timer exceeds the reference time value, a contaminated wire portion, such as a contaminated FAB, is removed, in operation 610, and, in operation 612, the bonding process is restarted.

Figure 13:
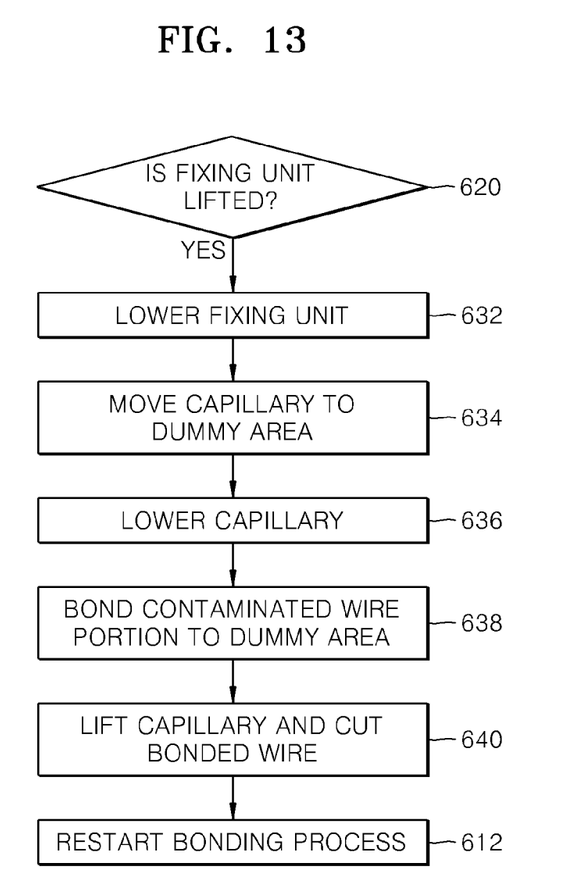
FIG. 13 illustrates a detailed flowchart of a bonding method according to an exemplary embodiment.

FIG. 13 illustrates a process of removing the contaminated wire portion, such as contaminated FAB, in more detail. In operation 620, it is determined whether the fixing unit has been lifted by the controller into a release position 59. If it is determined that the fixing unit is in the release position, the controller 300 controls the fixing unit 130 to be lowered to fix the lead frame 20 with the mounted package main body 54 on the support block 120, in operation 632. In operation 634, the controller 300 controls the capillary 200 to be moved to the dummy area 410, to remove the contaminated FAB. In operation 636, the capillary 200 is lowered and the FAB, to which the foreign substance is attached, is thereby brought into contact with the dummy area 410. In operation 638, the contaminated FAB bonded to the dummy area 410. In operation 640, the capillary 200 is lifted and the wire 201 is cut, thereby removing the contaminated FAB or the contaminated wire portion from the end portion of the capillary 200. In operation 612, the bonding process is restarted and is performed according to the processes described above.

The described-above exemplary embodiments and advantages are merely exemplary and are not to be construed as limiting. The present teaching can be readily applied to other types of apparatuses. The description of exemplary embodiments is intended to be illustrative, and not to limit the scope of the claims, and many alternatives, modifications, and variations will be apparent to those skilled in the art. Descriptions of features or aspects within each embodiment should typically be considered as available for other similar features or aspects in other embodiments.

What is claimed is:

1. A wire bonding method in a circuit device, the wire bonding method comprising:
    detecting a stop time duration while an operation of a capillary is stopped;
    removing a contaminated free air ball (FAB) formed on a wire at an end of the capillary if the stop time duration exceeds a reference time; and
    forming a new FAB and restarting a wire bonding process.

2. The wire bonding method of claim 1, wherein the circuit device is mounted on a lead frame and the removing the contaminated FAB comprises:
    moving the capillary to a dummy area of the lead frame which is an area different from that on which the circuit device is mounted; and
    bonding the contaminated FAB to the dummy area.

3. The wire bonding method of claim 1, wherein the circuit device is mounted on a lead frame and the method further comprises:
    releasing a fixing unit which fixes the lead frame on a support block if the stop time exceeds the reference time.

4. The wire bonding method of claim 3, further comprising:
    fixing the lead frame on the support block again by lowering the fixing unit after the contaminated FAB is removed; and
    restarting the bonding process.

5. The wire bonding method of claim 1, wherein the reference time comprises about three minutes.

6. A method comprising:
    detecting an error while a wire bonding process is performed by supplying a wire via a capillary;
    stopping the wire bonding process to remove the detected error;
    determining whether a stop time duration of an idle state of the wire bonding process exceeds a reference time;
    removing a contaminated wire portion from the capillary if the stop time duration is more than the reference time, and restarting the wire bonding process after the contaminated wire portion is removed; and
    continuing the wire bonding process if the stop time duration is less than or equal to the reference time.

7. The method of claim 6, wherein the determining comprises:
    detecting the stop time duration from when the wire bonding process is stopped until the error is removed.

8. The method of claim 6, wherein the wire bonding process is performed in a circuit device which is mounted to a lead frame fixed by a fixing unit, and
    the stopping comprises lifting the fixing unit to release the lead frame.

9. The method of claim 8, wherein the removing the contaminated wire portion comprises:
    lowering the fixing unit to fix again the circuit device and the lead frame;
    moving the capillary to a dummy area of the lead frame which is an area different from that on which the circuit device is mounted; and
    bonding the contaminated wire portion to the dummy area.

10. The method of claim 9, further comprising:
    lifting the capillary; and
    cutting the contaminated wire portion bonded to the dummy area, from the wire in the capillary.

11. The method of claim 9, wherein the contaminated wire portion comprises a free air ball (FAB) formed by a discharge process on a wire portion extending from the capillary, and
    the bonding comprises bonding the FAB to the dummy area.

12. The method of claim 9, further comprising:
    prior to the moving the capillary to the dummy area, forming a free air ball (FAB) by a discharge process on the contaminated wire portion extending from the capillary; and
    bonding the FAB to the dummy area.

* * * * *